US012812772B2

(12) United States Patent
Ky et al.

(10) Patent No.: US 12,812,772 B2
(45) Date of Patent: Nov. 24, 2026

(54) STEP-DOWN PRINTED CIRCUIT BOARD WITH A FLEXIBLE CONNECTOR

(71) Applicant: Sandisk Technologies, Inc., Milpitas, CA (US)

(72) Inventors: Jasen Ky, San Jose, CA (US); Lihwa Fong, Irvine, CA (US); Ning Ye, San Jose, CA (US); Nandha Kumar Mohanraj, Bangalore (IN); Jegathese Dhanachandra Prakash, Bangalore (IN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 335 days.

(21) Appl. No.: 18/584,729

(22) Filed: Feb. 22, 2024

(65) Prior Publication Data

US 2025/0275057 A1 Aug. 28, 2025

(51) Int. Cl.
*H05K 1/02* (2006.01)
*H05K 1/11* (2006.01)
(Continued)

(52) U.S. Cl.
CPC ......... *H05K 1/0278* (2013.01); *H05K 1/0284* (2013.01); *H05K 1/117* (2013.01);
(Continued)

(58) Field of Classification Search
CPC .... H05K 1/0278; H05K 1/0284; H05K 1/117; H05K 1/148; H05K 2201/10159;
(Continued)

(56) References Cited

U.S. PATENT DOCUMENTS

2010/0181661 A1* 7/2010 Takemoto ............ H10W 90/00 257/E23.141
2015/0351242 A1* 12/2015 Doering ................ H05K 1/144 439/59

(Continued)

OTHER PUBLICATIONS

Goetzman, A., “What are EDSFF Connectors?”, ConnectorSupplier, downloaded from URL<https://connectorsupplier.com/meet-the-connector-edsff-connectors/> on Apr. 22, 2026 (Year: 2026).*

(Continued)

*Primary Examiner* — J. E. Schoenholtz
(74) *Attorney, Agent, or Firm* — Dentons Durham Jones Pinegar P.C.

(57) ABSTRACT

A semiconductor package includes a step-down PCB. The step-down PCB includes a first portion having a first height and a second portion having a second height that is less than the first height. The step-down PCB can be a single, unitary structure or have different PCB portions. When the step-down PCB has different PCB portions, a flexible connector mechanically and electrically couples the PCB portions together. Due to the reduced thickness of the second portion, additional semiconductor dies can be added to a stack of semiconductor dies, thereby increasing the capabilities of the semiconductor package. Additionally, the first portion includes contacts for a connector. The connector is used to communicatively couple the semiconductor package to an associated connector slot of a host device.

20 Claims, 3 Drawing Sheets

(51) Int. Cl.

| | |
|---|---|
| ***H05K 1/14*** | (2006.01) |
| ***H10W 72/50*** | (2026.01) |
| ***H10W 90/00*** | (2026.01) |

(52) U.S. Cl.
CPC ............ *H05K 1/148* (2013.01); *H10W 90/00* (2026.01); *H05K 2201/10159* (2013.01); *H10W 72/5445* (2026.01); *H10W 90/752* (2026.01); *H10W 90/754* (2026.01)

(58) Field of Classification Search
CPC ..... H05K 3/4691; H05K 1/185; H10W 90/00; H10W 72/5445; H10W 90/752; H10W 90/754; H10W 90/24; H10W 74/114; H10W 74/01; H10W 70/688; H10B 80/00
See application file for complete search history.

(56) References Cited

U.S. PATENT DOCUMENTS

| | | | | |
|---|---|---|---|---|
| 2017/0118839 | A1* | 4/2017 | Brunschwiler | H05K 3/403 |
| 2020/0413531 | A1* | 12/2020 | Wallash | H05K 1/0259 |
| 2022/0404881 | A1* | 12/2022 | Burski | H05K 1/144 |
| 2023/0223307 | A1 | 7/2023 | Mohanraj et al. | |
| 2023/0369291 | A1* | 11/2023 | Boo | H10W 90/00 |
| 2025/0036590 | A1* | 1/2025 | Malladi | G06F 13/4027 |
| 2025/0181392 | A1* | 6/2025 | Choi | G06F 3/0604 |
| 2025/0275057 | A1* | 8/2025 | Ky | H05K 1/0278 |

OTHER PUBLICATIONS

Standard PCB Thickness Chart, by Best Circuit (Best Technology) Co. Lt. downloaded from URL< Standard PCB Thickness Chart, PCB Standard Thicknesses—PCB & MCPCB—EBest Technology> on Apr. 21, 2026. (Year: 2026).*

Enterprise and Datacenter Standard Form Factor Pin and Signal Specification, SFF-TA-1009 Rev 4.1a, SNIA, May 4, 2025. (Year: 2025).*

QwikConnect, GlenAir, vol. 26, No. 3, Jul. 2022. (Year: 2022).*

PCle M.2 Gen 3 and Gen 4 Card Edge Connectors, Amphenol Communications Solutions, downloaded from URL<https://www.amphenol-cs.com/product-series/pcie-m2.html> on Apr. 22, 2026. (Year: 2026).*

Tome, P., "Integrating Flex with Rigid PCB to Improve Design" EPEC Engineered Technologies, downloaded from URL<https://blog.epectec.com/integrating-flex-with-rigid-pcb-to-improve-design> on Apr. 22, 2026 (Year: 2019).*

"How Can I Connect Two Paralled Boards with an FPC both boards with components only on the top side" downloaded from URL<https://electronics.stackexchange.com/questions/672715/how-can-i-connect-two-parallel-boards-with-an-fpc-both-boards-with-components-o> on Apr. 22, 2026. (Year: 2026).*

Dunn, T., "Rigid-Flex PCBs: Advantages and Challenges" Altium Oct. 21, 2025 (Year: 2025).*

Wang, X., Zhoa, K. and Mcaky, K, "Catalina: PCle Gen5 EDSFF NVMe SSD Reference Designs, 1.01", Open Compute Project, Sep. 16, 2024. (Year: 2024).*

Tome, P., "How Rigid-Flex PCB Design Configurations are Advancing", EPIC downloaded from URL<https://www.epectec.com/articles/how-rigid-flex-pcb-design-configurations-are-advancing.html?_gl=1*wb4tug*_gcl_au*MTM2MjUxODEzNi4xNzc2Nzl3OTE0&_ga=2.159520189.1413010857.1776727914-1153807675.1776727914> (Year: 2026).*

Dunn, T., "Bridging the Gap: When to Use Rigid-Flex instead of Flex and Connector", Altium Academy, Oct. 8, 2025. (Year: 2025).*

* cited by examiner

STEP-DOWN PRINTED CIRCUIT BOARD WITH A FLEXIBLE CONNECTOR

BACKGROUND

Semiconductor packages, such as non-volatile memory devices, are widely used in various electronic devices such as cellular telephones, digital cameras, personal digital assistants, medical electronics, mobile computing devices, and non-mobile computing devices. In examples in which the semiconductor package is a non-volatile memory device, the semiconductor package includes a stack of memory dies, such as NAND memory dies. The capacity of the non-volatile memory device can be increased by adding additional memory dies to the stack. However, as additional memory dies are added to the stack, the height of the semiconductor package increases.

Increasing the height of the semiconductor package may not be feasible for a number of reasons. For example, electronic devices continue to get thinner and a semiconductor package having an increased height may not fit within the housing of the electronic device. In another example, the total height of the semiconductor package may be specified by one or more industry standards and/or constraints.

Accordingly, it would be beneficial for a semiconductor package to have increased capacity and/or capabilities without increasing the height of the semiconductor package.

SUMMARY

The present application describes a semiconductor package having a tiered or a step-down printed circuit board (PCB). The tiered or step-down PCB includes a first portion having a first thickness or height and a second portion having a second thickness or height that is less than the first thickness or height. In an example, the PCB is a single, unitary structure. In another example, the first portion and the second portion are separate PCBs but are connected by a flexible connector (e.g., a rigid flex).

In an example, various semiconductor dies and/or passive components are mounted or are otherwise coupled to the thinner portion of the PCB. As such, more semiconductor dies can be provided on the second portion when compared with solutions in which different portions of the PCB do not have different heights. For example, the increased height of a memory die stack can be offset by the reduced thickness of the PCB.

The first portion of the PCB, or the thicker portion of the PCB, includes contacts (e.g., gold finger contacts or other types of contacts) for a connector. The connector is used to communicatively couple the semiconductor package to an associated connector slot of a host device. In an example, the connector is an M.2 connector. In another example, the connector is an Enterprise and Datacenter Standard Form Factor (EDSFF) connector.

Accordingly, the present application describes a semiconductor package that includes a PCB portion having a first thickness and a second PCB portion having a second thickness that is less than the first thickness. A flexible connector is provided between the first PCB portion and the second PCB portion. In an example, the flexible connector mechanically and electrically connects the first PCB portion and the second PCB portion. A plurality of contacts are provided on the first PCB portion for electrically coupling the semiconductor package to a connector slot of a host device. Additionally, a plurality of semiconductor dies are provided on the second PCB portion.

Other examples describe a semiconductor package that includes a plurality of contacts provided on a first PCB portion. In an example, the first PCB portion also includes a first number of layers and has a first thickness. A plurality of semiconductor dies are provided on a second PCB portion. In an example, the second PCB portion is separate from the first PCB portion and has a second number of layers that is less than the first number of layers. The second PCB portion also has a second thickness that is less than the first thickness. In an example, a flexible connector couples the first PCB portion and the second PCB portion.

The present application also describes a semiconductor package that includes a first PCB portion having a first thickness and a second PCB portion having a second thickness that is less than the first thickness. A flexible connection means is provided between the first PCB portion and the second PCB portion. In an example, the flexible connection means mechanically and electrically couples the first PCB portion and the second PCB portion. The semiconductor package also includes a plurality of signal carrying means provided on a surface of the first PCB portion. Additionally, a plurality of semiconductor dies is provided on the second PCB portion.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
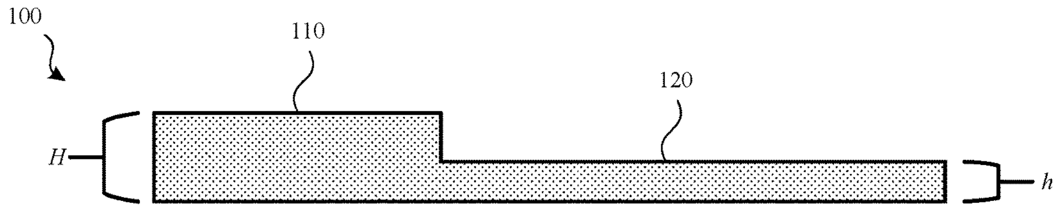
FIG. 1 illustrates a step-down printed circuit board (PCB) according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

The demand for semiconductor packages, such as non-volatile memory devices, is increasing. However, as the demand increases, so do the demands for higher capacity and better performance. In examples in which the semiconductor package is a non-volatile memory device, such as a NAND memory device, the non-volatile memory device includes a number of NAND memory dies stacked on top of one another. To increase capacity, additional memory dies are added to the stack.

As additional memory dies are added to the stack, the height of the semiconductor package increases. However, it may not be feasible to increase the height of the semiconductor package. For example, as electronic devices continue to get thinner, a thicker/taller semiconductor package may not fit within the housing of the electronic device. In another example, a height or thickness of the semiconductor package may need to comply with industry standards or constraints.

To address the above, the present application describes a semiconductor package that has a tiered or a step-down printed circuit board (PCB). In an example, the step-down PCB includes a first portion having a first thickness or height and a second portion having a second thickness or height. In an example, the second thickness or height is less than the first thickness or height.

The step-down PCB of the present disclosure has a number of different configurations. In one configuration, the step-down PCB is a single, unitary structure. In another configuration, the first portion and the second portion are separate PCBs. However, in this configuration, the first PCB portion and the second PCB portion are electrically and mechanically coupled using a flexible connector such as, for example, a rigid flex.

The first portion, or the thicker portion, of the PCB includes contacts (e.g., gold finger contacts or other types of contacts) for a connector. The connector is used to communicatively couple the semiconductor package to an associated connector slot of a host device. In an example, the connector is an M.2 connector. In another example, the connector is an Enterprise and Datacenter Standard Form Factor (EDSFF) connector.

In some examples, the first portion has a thickness or height that matches the thickness or height of the standard connector. For example, if the height of a standard M.2 connector is 0.8 millimeters (mm), the thickness or the height of the first portion is 0.8 mm.

In an example, various semiconductor dies and/or passive components are mounted (e.g., surface mounted) on or are otherwise coupled to the second/thinner portion of the PCB. As such, more semiconductor dies can be provided on the second portion when compared with current solutions. For example, the increased height of a memory die stack due to an increased number of semiconductor dies is offset by the reduced thickness of the second portion.

Accordingly, many technical benefits may be realized including, but not limited to, increasing the capacity and/or capabilities of a semiconductor package without increasing a height or thickness of the semiconductor package; enabling the semiconductor package to utilize standard connectors without requiring a host device to have a new type of connector; and allowing flexibility of placement and/or packaging options due to the use of a flexible connector.

These benefits, along with other examples, will be shown and described in greater detail with respect to FIG. 1-FIG. 4C.

FIG. 1 illustrates a step-down printed circuit board (PCB) 100 according to an example. Although a PCB is specifically mentioned, the examples described herein are applicable to a substrate or to any other material on which electronic components are placed and/or mounted.

In an example, the step-down PCB 100 is a single, unitary piece. For example, the step-down PCB 100 includes a first portion 110 having a first thickness or height (designated by "H") and a second portion 120 having a second thickness or height (designated by "h"). In an example, the first portion 110 of the step-down PCB 100 has the first thickness to enable the first portion 110 to act as a connector. For example and as will be described in greater detail below, the first portion 110 includes a number of contacts that enables the first portion 110 to be received into a standard connector slot of a host device.

In an example, the height H (or the thickness) of the first portion 110 of the step-down PCB is 0.8 millimeters (mm). In such an example, the first portion 110, along with the various contacts that are provided on the first portion, are used as an M.2 connector. In another example, the height H of the first portion 110 of the step-down PCB 100 is 1.57 mm. In such an example, the first portion 110, along with the various contacts provided on the first portion 110, are used as an EDSFF connector. Although an M.2 connector and an EDSFF connector are specifically mentioned, the height and/or thickness of the first portion 110 may be any height or thickness depending on the desired type of connector.

In an example, the thickness or height h of the second portion 120 may also vary. For example, when the step-down PCB 100 is used as part of a non-volatile memory device, the height h of the second portion 120 is dependent on a desired capacity of the non-volatile memory device and/or on the number of memory dies in the stack. In another example, the height h of the second portion 120 is dependent on a type of cover that will be placed on or over the various semiconductor dies and/or passive components placed on/in the second portion 120.

In yet another example, the height h of the second portion 120 is dependent on the type of semiconductor package and/or on the size of the first portion 110. For example, if the first portion 110 of the step-down PCB 100 has a height H of 1.57 mm, the second portion 120 has a height h of 0.95 mm. In another example, if the first portion 110 of the step-down PCB 100 has a height H of 0.8 mm, the second portion 120 has a height h of 0.2 mm. Although specific dimensions are given, these are for example purposes only.

In the example shown, the step-down PCB 100 is fabricated such that the second portion 120 extends from a lower or bottom portion of the first portion 110. For example, a bottom surface of the second portion 120 is planar to a bottom surface of the first portion 110. However, in other examples, the second portion 120 extends from any portion (e.g., a top portion, a middle portion) of the first portion 110. In an example, during fabrication, one or more layers of the second portion 120 are removed which causes the second portion 120 to have the height h.

The first portion 110 and the second portion 120 may have any length. In an example, the length of the first portion 110 is dependent on the number and/or type of contacts that are used to make up the connector. In another example, the length of the first portion 110 is dependent on an arrangement of traces or other communication lines that are used to connect the contacts on the first portion 110 with the semiconductor dies on the second portion 120. In an example, the length of the second portion 120 is dependent on the number or type of semiconductor dies that will be placed on the second portion 120 and/or the number or type of passive components that will be placed on the second portion 120.

Figure 2A:
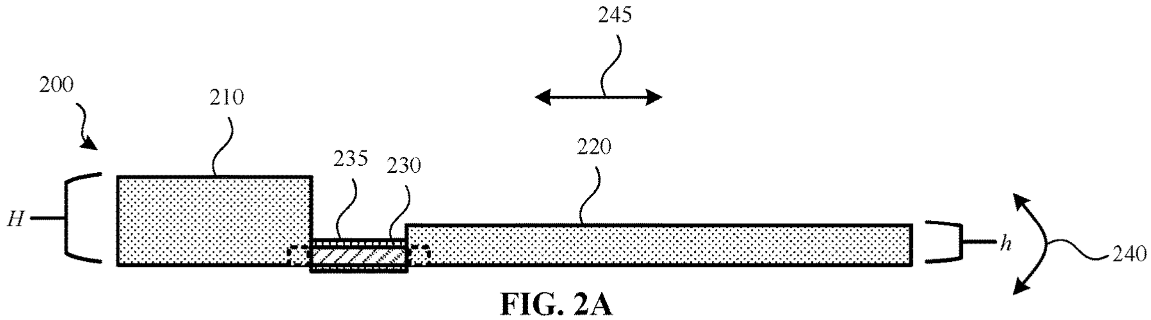
FIG. 2A illustrates a step-down PCB having a first PCB portion and a second PCB portion connected by a flexible connector according to an example.

FIG. 2A illustrates a step-down PCB 200 having a first PCB portion 210 and a second PCB portion 220 connected by a flexible connector 230 according to an example. In an example, the flexible connector 230 is a rigid flex. Although a rigid flex is specifically mentioned, the first portion 210 and the second portion 220 are connectable by any flexible and/or rigid material that provides both an electrical connection and a mechanical connection between each portion and/or between the various components on each portion.

In an example, the first portion 210 has a first thickness or height (designated by "H"). Likewise, the second portion 220 has a second thickness or height (designated by "h"). Like the example shown in FIG. 1, the first thickness of the first portion 210 enables the first portion 210 to act as a connector.

Additionally, in some examples, the height H (or the thickness) of the first portion 210 of the step-down PCB 200 is 0.8 millimeters (mm). In another example, the height H of the first portion 210 of the step-down PCB 200 is 1.57 mm. Although specific thicknesses or heights are mentioned, the height and/or thickness of the first portion 210 may be any height or thickness depending on a type of connecter that is needed.

In an example, the thickness or height h of the second portion 220 also varies. For example, when the step-down PCB 200 is used as part of a non-volatile memory device, the height h of the second portion 220 is dependent on a desired capacity of the non-volatile memory device and/or on the number of memory dies in the stack. In another example, the height h of the second portion 220 is dependent on a type of cover that will be placed on or over the various semiconductor dies and/or passive components placed on/in the second portion 220.

In an example, the flexible connector 230 mechanically and/or electrically couples the first portion 210 of the step-down PCB 200 to the second portion 220 of the step-down PCB 200. In an example, the flexible connector 230 enables the first portion 210 and/or the second portion 220 to move or pivot relative to one another (e.g., in the direction of arrows 240). In another example, the flexible connector enables the first portion 210 and/or the second portion 220 to move laterally with respect to one another (e.g., in the direction of arrows 245). As a result, the overall length of the step-down PCB 200 may be adjusted (e.g., shortened).

The flexible connector 230 mechanically and/or electrically couples to each portion by any suitable means. For example, a proximal end of the flexible connector 230 (represented by the dashed lines) is coupled to and/or sandwiched between one or more layers of the first portion 210 of the step-down PCB 200. Likewise, a distal end of the flexible connector 230 is coupled to and/or sandwiched between one or more layers of the second portion 220 of the step-down PCB 200. In an example, the flexible connector 230 includes traces, signal lines, or other communication paths that enable the semiconductor dies and/or passive components on the second portion 220 to be electrically and/or communicatively coupled to the respective contacts on the first portion 210.

In an example, a protective and/or flexible coating or cover 235 is applied to the flexible connector 230. The flexible cover 235 may be made from any material and is used to protect and/or insulate the traces, signal lines or other communication paths that extend through the flexible connector 230 and communicatively couple the first portion 210 to the second portion 220.

In an example, the flexible connector 230 is coupled to a bottom portion of the first portion 210 and a bottom portion of the second portion 220. For example, the flexible connector 230 is coupled to each portion such that a bottom surface of the second portion 220 is planar to a bottom surface of the first portion 210. However, in other examples, the flexible connector 230 is coupled to any portion of the first portion 210 and/or the second portion 220.

Figure 2B:
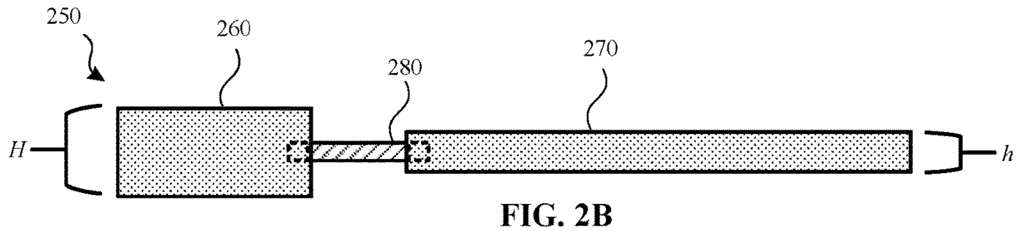
FIG. 2B illustrates a step-down PCB having a first PCB portion and a second PCB portion connected by a flexible connector according to another example.

For example and referring to FIG. 2B, FIG. 2B illustrates a step-down PCB 250 having a first PCB portion 260 and a second PCB portion 270 connected by a flexible connector 280 according to another example. In an example, the step-down PCB 250 is similar to the step-down PCB 200 shown and described with respect to FIG. 2A. However, in this example, the flexible connector 280 extends from, or is otherwise coupled to, a middle portion of the first portion 260 and to a middle portion of the second portion 270.

In the examples shown in FIG. 2A and FIG. 2B, each portion may have any length. For example, the length of the first portion 210 of the step-down PCB 200 is dependent on the number and/or type of contacts that are used to make up the connector. In another example, the length of the first portion 210 is dependent on an arrangement of traces or other communication lines that are used to connect the contacts with the semiconductor dies on the second portion 220 of the step-down PCB 200. In an example, the length of the second portion 220 is dependent on the number or type of semiconductor dies that will be placed on the second portion 220 and/or the number or type of passive components that will be placed on the second portion 220.

Figure 3A:
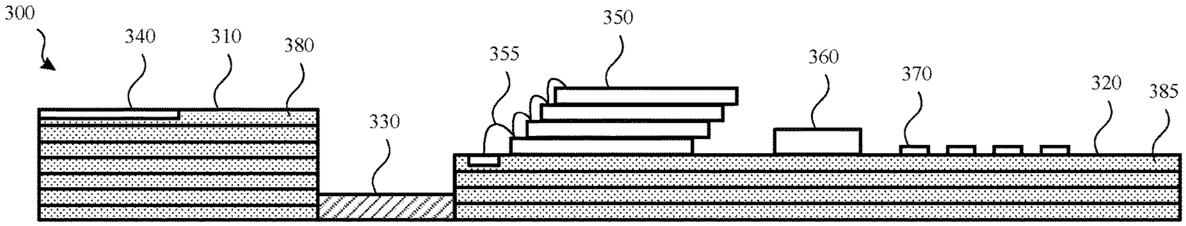
FIG. 3A illustrates a semiconductor package having a step-down PCB according to an example.

FIG. 3A illustrates a semiconductor package 300 having a step-down PCB according to an example. In the example shown in FIG. 3A, the step-down PCB is similar to the step-down PCB 200 shown and described with respect to FIG. 2A. However, the semiconductor package 300 may have any of the various step-down PCBs shown and described herein.

In this example, the step-down PCB includes a first portion 310 and a second portion 320. The second portion 320 is separate, and apart from, the first portion 310. In an example, the first portion 310 includes a first number of layers 380 and the second portion 320 includes a second number of layers 385.

In an example, and although the first portion 310 and the second portion 320 are separate and apart from one another, a flexible connector 330 electrically and/or mechanically couples the first portion 310 and the second portion 320. In an example, the flexible connector 330 is a rigid flex, although any connector may be used to communicatively couple the first portion 310 to the second portion 320.

In an example, the first portion 310 includes a number of contacts 340 (e.g., gold finger contacts) that comprise a connector. In an example, the connector is an M.2 connector. In another example, the connector is an EDSFF connector. Although specific connectors are described, the contacts 340 may be part of any desired connector type. Likewise, a height or thickness of the first portion 310 may be based, at least in part, on the type of connector desired.

For example, if the connector is an M.2 connector, the height or thickness of the first portion 310 is 0.8 mm. However, if the connector is an EDSFF connector, the height or thickness of the first portion 310 is 1.57 mm. Although specific heights are described, the first portion 310 may have any height based on a desired connector type and/or on the dimensions of a connector slot of a host device to which the semiconductor package 300 will be communicatively coupled.

As also shown in FIG. 3A, the second portion 320 includes a number of semiconductor dies and/or passive components. In an example, the semiconductor dies and/or the passive components are surface mounted or are otherwise electrically coupled to the second portion 320. For example, the semiconductor package 300 includes a number of memory dies 350 arranged in a stacked configuration. In this example, each of the memory dies 350 in the stack is communicatively coupled to the second portion 320 using one or more bond wires 355.

In an example, an application specific integrated circuit (ASIC) 360 is also mounted on, or is otherwise associated with, the second portion 320. In an example, the ASIC 360 is a controller or a processor. Although a single ASIC 360 is shown, multiple ASICs 360 may be provided on, or associated with, the second portion 320.

In addition to the semiconductor dies, the semiconductor package 300 also includes passive components 370. In an example, the passive components 370 are also mounted to the second portion 320 of the step-down PCB. Although specific components and semiconductor dies are mentioned, the semiconductor package 300 may include any number of different electronic components, semiconductor devices and/or dies.

Figure 3B:
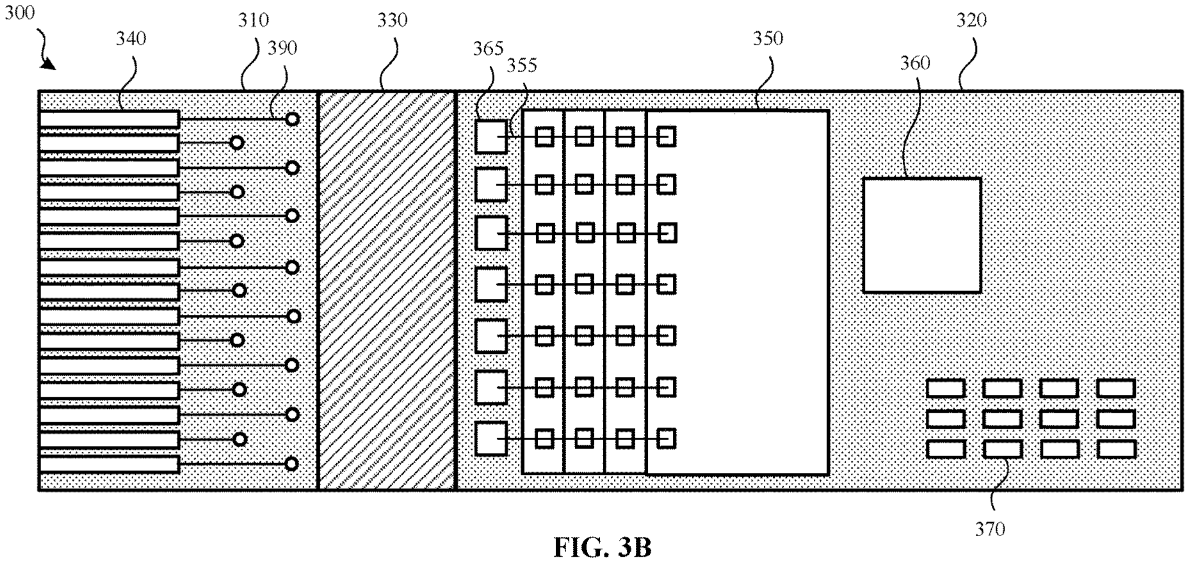
FIG. 3B illustrates a top view of the semiconductor package of FIG. 3A according to an example.

FIG. 3B illustrates a top view of the semiconductor package 300 of FIG. 3A according to an example. As shown in FIG. 3B, the semiconductor package 300 includes the first portion 310 and the second portion 320. The flexible connector 330 mechanically and electrically couples the first portion 310 and the second portion 320 such as previously described.

In an example, the first portion 310 includes a plurality of contacts 340 provided on an upper surface. However, in an example, additional contacts are provided on a bottom surface of the first portion 310.

In an example, signal lines 390 electrically and/or communicatively couple the contacts 340 to respective semiconductor dies on the second portion 320. For example, one or more signal lines 390 extend through the first portion 310, through the flexible connector 330, and to respective bond pads 365 associated with the stack of semiconductor dies 350. In another example, one or more signal lines 390 extend through the first portion 310, through the flexible connector 330, and to the ASIC 360. Additional signal lines 390 may also electrically couple the passive components 370 to one or more of the various semiconductor dies and/or the contacts 340.

Figure 4A:
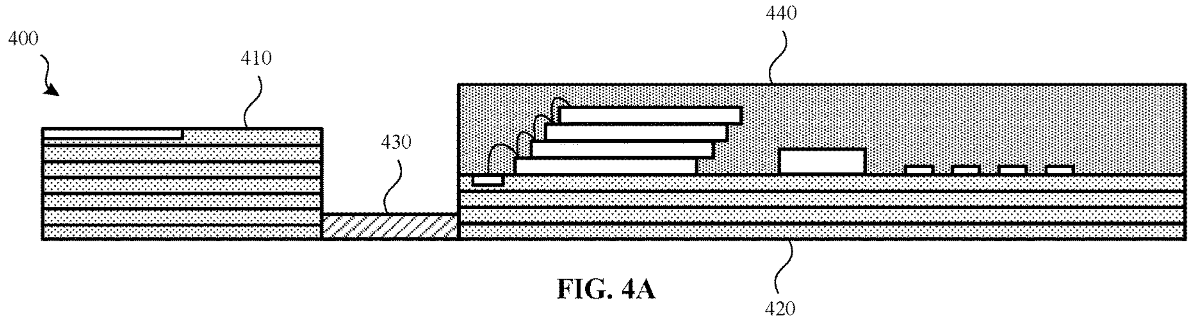
FIG. 4A illustrates a semiconductor package in which one of the PCB portions is encapsulated according to an example.

FIG. 4A illustrates a semiconductor package 400 in which one of the PCB portions is encapsulated according to an example. In an example, the semiconductor package 400 is similar to the semiconductor package 300 shown and described with respect to FIG. 3A and FIG. 3B. For example, the semiconductor package 400 includes a number of different semiconductor dies and passive components. Additionally, the semiconductor package 400 includes a step-down PCB having a first portion 410, a second portion 420 separate from the first portion 410 and a flexible connector 430. However, the semiconductor package 400 may have any of the various step-down PCBs shown and described herein.

In this example, the second portion 420 includes a cover 440. In an example, the cover 440 is a mechanical cover. In another example, the cover 440 is a molding compound. In yet another example, the cover 440 is a mechanical cover that surrounds or otherwise encapsulates a molding compound. However, in this example, the cover 440 only encapsulates the second portion 420 (or at least some of the passive components and/or semiconductor dies on the second portion 420) but not the flexible connector 430 or the first portion 410.

Figure 4B:
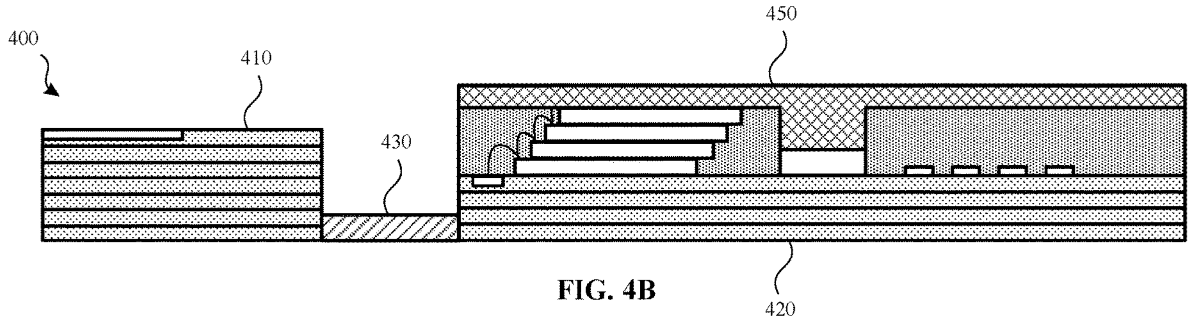
FIG. 4B illustrates a semiconductor package in which a PCB portion is encapsulated and includes a heat dissipation feature according to an example.

FIG. 4B illustrates a semiconductor package 400 in which a PCB portion is encapsulated and includes a heat dissipation feature 450 according to an example. Like the example shown and described with respect to FIG. 4A, the semiconductor package includes a step-down PCB having a first portion 410, a second portion 420 separate from the first portion 410 and a flexible connector 430.

In this example, the second portion 420 includes a heat dissipation feature 450. In an example, the heat dissipation feature 450 is part of, or is otherwise included with, a cover (e.g., cover 440 (FIG. 4A)) or other material that encapsulates the various components on the second portion 420. In an example, the heat dissipation feature 450 is a silicon layer. Although a heat dissipation feature 450 is specifically mentioned, an electromagnetic interference (EMI) layer may be included in lieu of, or in combination with, the heat dissipation feature 450.

In an example, the heat dissipation feature 450 contacts a top surface of a semiconductor die stack and/or an ASIC. In some examples, the heat dissipation feature 450 extends across the entire length of the cover and/or the second portion 420. In another example, the heat dissipation feature 450 is broken up into different segments or portions. In such an example, a first portion of the heat dissipation feature 450 contacts a top surface of the semiconductor die stack while a second portion of the heat dissipation feature 450 contacts a top surface of the ASIC. The heat dissipation feature 450 conducts heat away from the ASIC and/or the stack of semiconductor dies and into the cover or other material that surrounds or encapsulates the second portion 420.

Figure 4C:
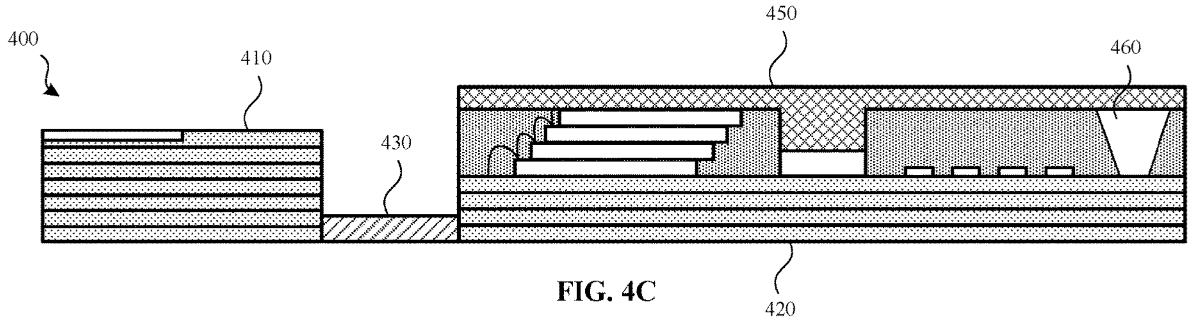
FIG. 4C illustrates a semiconductor package in which a PCB portion is encapsulated and includes multiple heat dissipation features according to an example.

FIG. 4C illustrates a semiconductor package 400 in which a PCB portion is encapsulated and includes multiple heat dissipation features according to an example. Like the examples shown in FIG. 4A and FIG. 4B, the semiconductor package 400 includes a step-down PCB having a first portion 410, a second portion 420 separate from the first portion 410 and a flexible connector 430.

In this example, the second portion 420 includes multiple heat dissipation features. For example, the second portion 420 includes the heat dissipation feature 450 shown and described with respect to FIG. 4B. Additionally, the second portion 420 includes a chimney or trench 460 that dissipates heat from within the second portion 420 of the semiconductor package 400 and to the heat dissipation feature 450. In an example, the trench 460 is filled with a thermally conductive material, such as silver, although other materials may be used. Additionally, although a single trench 460 is shown, multiple trenches 460 may be provided in the second portion 420 of the semiconductor package 400.

Based on the above, examples of the present disclosure describe a semiconductor package, comprising: a first printed circuit board (PCB) portion having a first thickness; a second PCB portion having a second thickness that is less than the first thickness; a flexible connector provided between the first PCB portion and the second PCB portion, the flexible connector mechanically and electrically connecting the first PCB portion and the second PCB portion; a plurality of contacts provided on the first PCB portion for electrically coupling the semiconductor package to a connector of a host device; and a plurality of semiconductor dies provided on the second PCB portion. In an example, the semiconductor package also includes one or more passive components mounted on the second PCB portion. In an example, at least one of the plurality of semiconductor dies is a NAND memory die. In an example, at least one of the plurality of semiconductor dies is an application-specific integrated circuit (ASIC). In an example, the semiconductor package also includes a molding compound at least partially covering the second PCB portion. In an example, the plurality of contacts are part of an M.2 connector. In an example, the plurality of contacts are part of an Enterprise and Datacenter Standard Form Factor (EDSFF) connector. In an example, the flexible connector extends from a top portion of the first PCB portion. In an example, the flexible connector extends from a middle portion of the first PCB portion. In an example, the flexible connector extends from a top portion of the second PCB portion. In an example, the flexible connector extends from a middle portion of the second PCB portion.

Examples also describe a semiconductor package, comprising: a plurality of contacts provided on a first printed circuit board (PCB) portion, the first PCB portion having a first number of layers and a first thickness; a plurality of semiconductor dies provided on a second PCB portion, the second PCB portion being separate from the first PCB portion and having a second number of layers that is less than the first number of layers and having a second thickness that is less than the first thickness; and a flexible connector coupling the first PCB portion and the second PCB portion. In an example, the semiconductor package also includes a cover at least partially encapsulating the second PCB portion. In an example, the plurality of contacts form an M.2 connector. In an example, the plurality of contacts form an Enterprise and Datacenter Standard Form Factor (EDSFF) connector. In an example, the flexible connector extends from a top portion of the first PCB portion. In an example, the flexible connector extends from a middle portion of the second PCB portion.

Additional examples describe a semiconductor package, comprising: a first printed circuit board (PCB) portion having a first thickness; a second PCB portion having a second thickness that is less than the first thickness; a flexible connection means provided between the first PCB portion and the second PCB portion, the flexible connection means mechanically and electrically coupling the first PCB portion and the second PCB portion; a plurality of signal carrying means provided on a surface of the first PCB portion; and a plurality of semiconductor dies provided on the second PCB portion. In an example, the semiconductor package also includes a covering means provided on the second PCB portion. In an example, the semiconductor dies are NAND memory dies.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features are intended to be selectively rearranged, included or omitted to produce various embodiments with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A semiconductor package, comprising:

a first printed circuit board (PCB) portion having a first thickness;

a second PCB portion separate from the first PCB portion and having a second thickness that is less than the first thickness, the second PCB portion extending laterally from the first PCB portion;

a flexible connector provided between the first PCB portion and the second PCB portion, the flexible connector mechanically and electrically connecting the first PCB portion and the second PCB portion;

a plurality of contacts provided on the first PCB portion for electrically coupling the semiconductor package to a connector of a host device; and a plurality of semiconductor dies provided on the second PCB portion and arranged in a stacked configuration.

2. The semiconductor package of claim 1, further comprising one or more passive components mounted on the second PCB portion.

3. The semiconductor package of claim 1, wherein at least one of the plurality of semiconductor dies is a NAND memory die.

4. The semiconductor package of claim 1, wherein at least one of the plurality of semiconductor dies is an application-specific integrated circuit (ASIC).

5. The semiconductor package of claim 1, further comprising a molding compound at least partially covering the second PCB portion.

6. The semiconductor package of claim 1, wherein the plurality of contacts are part of an M.2 connector.

7. The semiconductor package of claim 1, wherein the plurality of contacts are part of an Enterprise and Datacenter Standard Form Factor (EDSFF) connector.

8. The semiconductor package of claim 1, wherein the flexible connector extends from a top portion of the first PCB portion.

9. The semiconductor package of claim 1, wherein the flexible connector extends from a top portion of the second PCB portion.

10. A semiconductor package, comprising:

a plurality of contacts provided on a first printed circuit board (PCB) portion for electrically coupling the semiconductor package to a connector of a host device, the first PCB portion having a first number of layers and a first thickness;

a plurality of semiconductor dies arranged in a stacked configuration and provided on a second PCB portion, the second PCB portion being separate from the first PCB portion and having a second number of layers that is less than the first number of layers and having a second thickness that is less than the first thickness, a bottom surface of the second PCB portion being coplanar with a bottom surface of the first PCB portion; and a flexible connector coupling the first PCB portion and the second PCB portion.

11. The semiconductor package of claim 10, further comprising a cover at least partially encapsulating the second PCB portion.

12. The semiconductor package of claim 10, wherein the flexible connector extends from a top portion of the first PCB portion.

13. A semiconductor package, comprising:

a first printed circuit board (PCB) portion having a first thickness;

a second PCB portion separate from the first PCB portion and having a second thickness that is less than the first thickness, the second PCB portion extending laterally from the first PCB portion;

a flexible connection means provided between the first PCB portion and the second PCB portion, the flexible connection means mechanically and electrically coupling the first PCB portion and the second PCB portion;

a plurality of signal carrying means provided on a surface of the first PCB portion; and a plurality of semiconductor dies provided on the second PCB portion and arranged in a stacked configuration.

14. The semiconductor package of claim 13, further comprising a covering means provided on the second PCB portion.

15. The semiconductor package of claim 1, wherein the second PCB portion includes a heat dissipation feature contacting a top surface of the stacked configuration of semiconductor dies.

16. The semiconductor package of claim 15, wherein the second PCB portion further includes a trench filled with a thermally conductive material, the trench arranged to conduct heat from within the second PCB portion to the heat dissipation feature.

17. The semiconductor package of claim 1, wherein the second PCB portion includes a second number of layers that is less than a first number of layers of the first PCB portion.

18. The semiconductor package of claim 1, wherein a bottom surface of the second PCB portion is coplanar with a bottom surface of the first PCB portion.

19. The semiconductor package of claim 10, further comprising one or more signal lines extending through the first PCB portion, through the flexible connector, and to bond pads associated with the semiconductor dies.

20. The semiconductor package of claim 13, wherein a bottom surface of the second PCB portion is coplanar with a bottom surface of the first PCB portion.

* * * * *